United States Patent
Tsao et al.

(10) Patent No.: US 7,003,362 B2
(45) Date of Patent: Feb. 21, 2006

(54) SYSTEM AND METHOD FOR CUSTOMIZED TAPE-OUT REQUESTS FOR INTEGRATED CIRCUIT MANUFACTURING

(75) Inventors: Piao-Chuo Tsao, Bade (TW); Shu-Ling Feng, Hsinchu (TW); Yi-Hong Tseng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 74 days.

(21) Appl. No.: 10/842,890

(22) Filed: May 11, 2004

(65) Prior Publication Data

US 2005/0256602 A1   Nov. 17, 2005

(51) Int. Cl.
*G06F 19/00* (2006.01)
(52) U.S. Cl. .................................. 700/97; 715/964
(58) Field of Classification Search ................. 700/17, 700/18, 28, 83, 86, 87, 95–97, 117–121, 180, 700/182; 716/1, 5, 19; 715/962, 964
See application file for complete search history.

(56) References Cited

U.S. PATENT DOCUMENTS

| | | | |
|---|---|---|---|
| 5,134,248 A | 7/1992 | Kiec et al. | |
| 5,646,068 A | 7/1997 | Wilson et al. | |
| 6,071,658 A | 6/2000 | Wu et al. | |
| 6,243,653 B1 | 6/2001 | Findley | |
| 6,552,910 B1 | 4/2003 | Moon et al. | |
| 6,560,117 B1 | 5/2003 | Moon et al. | |
| 6,578,174 B1 * | 6/2003 | Zizzo .......................... 716/1 |
| 6,594,799 B1 * | 7/2003 | Robertson et al. ............. 716/1 |
| 6,643,841 B1 * | 11/2003 | Chang et al. ................. 716/19 |
| 6,704,917 B1 * | 3/2004 | Curran et al. ................. 716/11 |
| 6,725,435 B1 * | 4/2004 | Cote et al. ..................... 716/5 |
| 6,742,165 B1 * | 5/2004 | Lev et al. ....................... 716/1 |
| 6,801,826 B1 * | 10/2004 | Tanabe ....................... 700/121 |
| 6,807,663 B1 * | 10/2004 | Cote et al. .................... 716/21 |
| 6,851,094 B1 * | 2/2005 | Robertson et al. ............. 716/1 |

\* cited by examiner

*Primary Examiner*—Maria N. Von Buhr
(74) *Attorney, Agent, or Firm*—Haynes and Boone, LLP

(57) ABSTRACT

The present disclosure provides a system and method for a tape-out request. In one example, the method includes receiving initial information from a customer and loading a mask tooling template based on the initial information. A mask tooling form may be customized based on metal layer information provided by the customer via the mask tooling template and answers to questions provided to the customer. The method may then generate logical operations based on information received from the customer via the mask tooling form.

30 Claims, 7 Drawing Sheets

Customized MT Form

Buttons: Company | Product | Contact Person | Telephone | Email
Save As Draft | Check | Save | Back

| ID | Process Layer | CAD Layer # | Process Key CAD Layer # | DGTA Tone | Bias Logical Operation | Bias Logical Operation Translation |
|---|---|---|---|---|---|---|
| 120 | OD1-ETCH | 6;5 | | D | 0 | (6;5 SIZING 0) |
| 121 | ODR-ETCH | 73 | | C | (((120SIZING-0.4)SIZING0.4)SIZE-0.2) | (((6;5 SIZING-0.4)SIZING0.4)SIZE-0.2) |
| 191 | WELL-P-IMP | N/A | N/A | D | | |
| 193 | LDD-N-I/O-IMP | N/A | N/A | C | | |
| 192 | OD2-ETCH | N/A | N?A | C | | |

Fig. 6

SYSTEM AND METHOD FOR CUSTOMIZED TAPE-OUT REQUESTS FOR INTEGRATED CIRCUIT MANUFACTURING

BACKGROUND

The present disclosure relates generally to the field of semiconductor manufacturing and, more particularly, to a system and method for tape-out requests.

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing have been needed.

Furthermore, as the IC industry has matured, the various operations needed to produce an IC may be performed at different locations by a single company or by different companies that specialize in a particular area. This further increases the complexity of producing ICs, as companies and their customers may be separated not only geographically, but also by time zones, making effective communication more difficult. For example, a first company (e.g., an IC design house) may design a new IC, a second company (e.g., an IC foundry) may provide the processing facilities used to fabricate the design, and a third company may assemble and test the fabricated IC. A fourth company may handle the overall manufacturing of the IC, including coordination of the design, processing, assembly, and testing operations.

Whether in the context of a single facility or multiple facilities, communication issues may present problems in a number of areas, such as in the fabrication of IC's designed by a customer. For example, in IC manufacturing processes that use a photomask to create such devices as application specific integrated circuits (ASICs) or multi project wafers (MPWs), the mask design generally involves communication between customers and mask manufacturing facilities. The process of preparing and finalizing mask design information for an IC (e.g., mask design tape-out) generally involves both the customer ordering the IC and engineers from the manufacturing facility. The customer may provide tape-out information to a manufacturing facility using a number of different formats. This introduces additional complexity into the tape-out process, as engineers from the manufacturing facility may need to manually check the data provided by the customer and communicate with the customer regarding aspects of the tape-out information that are unclear or incorrect.

Accordingly, what is needed is an improved system and method for mask design tape-out in IC manufacturing.

BRIEF DESCRIPTION OF THE DRAWINGS

FIG. 6 illustrates an exemplary interface for a customized mask tooling form that may be used within the environment of FIG. 3.

DETAILED DESCRIPTION

Figure 1:
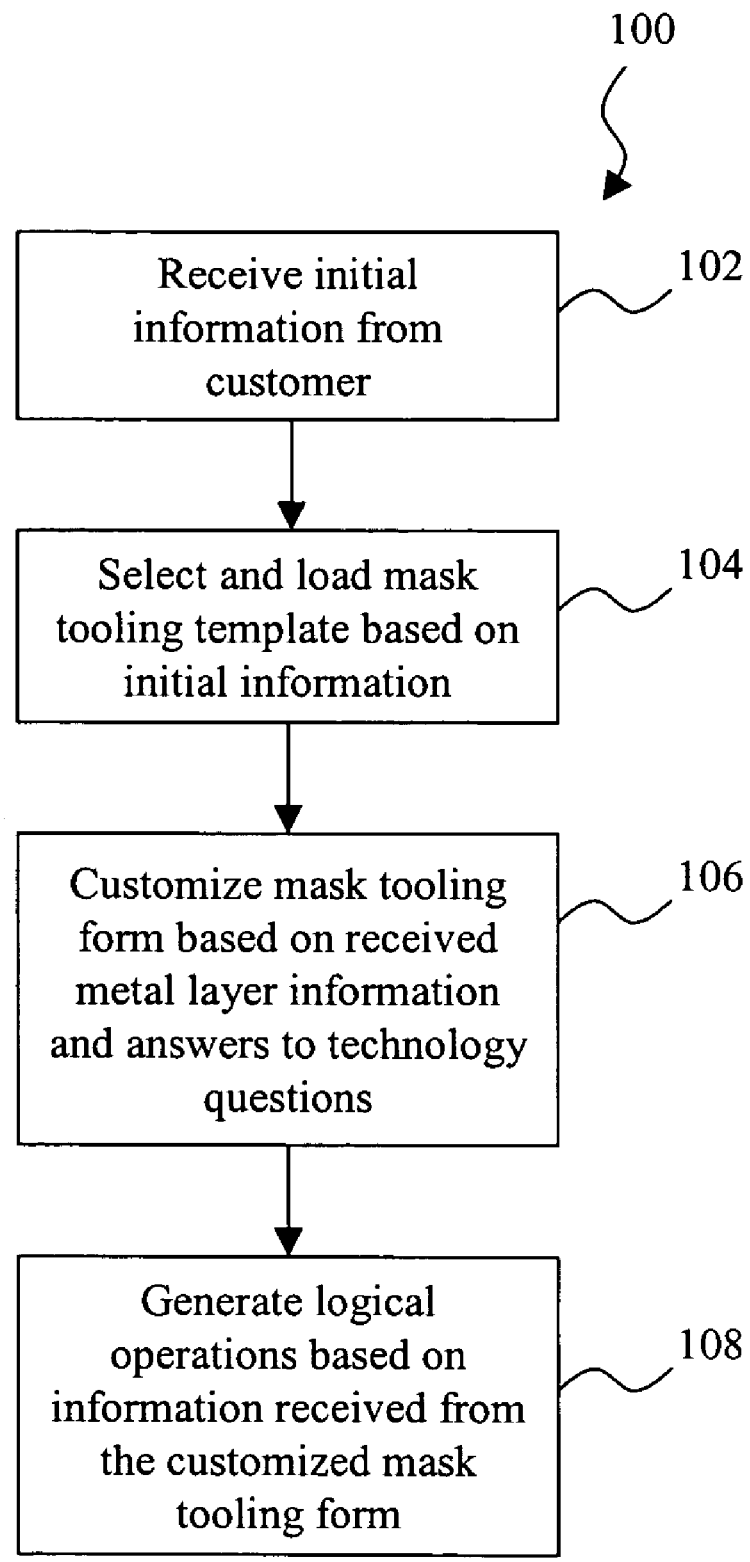
FIG. 1 is a flowchart of one embodiment of a method for handling a tape-out request.

The present disclosure relates generally to the field of semiconductor manufacturing and, more particularly, to a system and method for tape-out requests. It is understood, however, that the following disclosure provides many different embodiments and examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

In an integrated circuit (IC) mask design tape-out process, customers may complete various forms, such as a mask tooling (MT) form, a foundry service request form (FSRF), and a special technology information (STI) form. Technology providers, such as customer engineers or masking engineers from a manufacturing facility, may then assist the customers with converting these forms into tape-out requests for ordering and creating masks.

In some fabrication processes, such as a multi-project wafer (MPW) service in which one wafer may contain the circuits of two or more different projects, a manufacturing group may prepare a rough MT template form for the customer. Such a prepared form may provide a whole set of masks that are available for customers, although the customer may still need to fill out the MT, FSR, and STI forms to provide additional information specific to their design.

Referring to FIG. 1, in one embodiment, a method 100 may aid in the creation of a tape-out request for an IC mask design. Tape-out may represent a stage when a design database for a IC is ready to be transferred to a chip manufacturing operation. The method 100 may be used to respond to a tape-out request by a customer while minimizing or eliminating the need for engineer interaction. In the following disclosure, the term customer is representative of any user or process that may interact with or take part in a tape-out request and/or the handling of such a request, as well as any user or process that may supply services supporting such a request or its handling.

In step 102, initial information may be received from a customer. It is understood that the customer may login to the tape-out request system using privilege verification information, such as a user ID and password, prior to entering the initial information. The initial information may include information about a current order, such as a company name, an order ID, and technology information about the tape-out request. The technology information may identify one or more details about the current order, such as whether the tape-out request is for a design using 0.13 µm or 0.18 µm technology.

In step 104, an MT template may be selected and loaded based on the technology information entered by the customer in step 102. As will be described later in greater detail, the MT template may provide an interface for the customer to enter masking related information, such as a layer code, a mask layer name description, and/or logical operation. Such an MT template may be systematically built according to technology definitions (e.g., 0.13 μm or 0.18 g/m node technology). In some embodiments, the MT template may be a superset of data, with the customer selecting options from or entering data into relevant portions of the template. In other embodiments, the masking information maintained in the MT template may be tailored to serve the particular customer's requirements. Accordingly, some items in an MT template may have default values or multiple options for a particular technology. The customer may select information (if options are presented) or enter information for each item not having default information or for which the default information does not match the customer's needs for a particular application.

An STI template may be generated and/or loaded to provide one or more technology questions to be answered by the customer. The technology questions may be generated or loaded based on the initial information entered by the customer. As with the MT template, the STI template may be a superset of questions, with the customer answering only the relevant questions, or the STI template questions may be tailored to serve the particular customer's requirements.

In step 106, a customized MT form may be generated or selected based on metal layer information specified by the customer in the MT template. The metal layer information may be used to customize mask information in the MT form. For example, a top via and metal layer defined in the MT form may be updated based on customer input. Optional interlayer metal masks may be removed or marked as inactive to aid in eliminating or minimizing unnecessary customer interaction. In some embodiments, as a metal layer mask and via mask are paired together, the metal layer and via may be removed in pairs based on the customer's input.

The MT form may also be customized based on the customer's answer to one or more STI questions. Some or all STI questions may be predefined by manufacturing engineers to identify information needed for manufacturing. Each STI question may be associated with one or more mask layers and specifically designed to gain information related to that particular layer. Exemplary STI questions may include: whether a metal-insulator-metal (MIM) capacitor is needed; whether electro-static discharge (ESD) implantation is needed; and/or whether a pure 1.8 V device is allowed. If optional masks are available, the answers to the STI questions may indicate which optional masks are required for the customer's design and which optional masks are not required.

The customization of the MT form may include, for example, indicating non-required mask layers in the MT form using a gray background and/or marking such layers as inactive to prevent further customer input, thereby eliminating unnecessary customer interaction. If options are presented to the customer in the MT form, the options may be customized by removing unneeded options or disabling them to prevent customer selection of such items. The customization may also include automatically entering certain values into the MT form based on the customer's metal layer selection and answers to the STI questions.

In step 108, logical operations may be generated after the customer has entered data into the customized MT form. For example, a generated logical operation may appear as follows:

114=(((((((NP NOT NW) NOT (OD2 SIZING-0.03)) NOT RHDMY) NOT VARDMY) SIZING 0.14)SIZING-0.28) SIZING 0.14).

The logical operations may be automatically generated from a variety of sources, including a vendor's standard database, customer input, or a combination of both. For example, one logical operation may be selected from a database using information from the MT form. Another logical operation may be entered by the customer, while another may be dynamically generated. Accordingly, bias logic operation information associated with each mask may be generated based on the information provided by the customer and/or information available from a tape-out request system.

The method 100 may be used to extend customer service so that a customer can independently (e.g., with minimal or no engineering support from a manufacturing facility) request a tape-out process. The method 100 may also reduce manufacturing cycle time by minimizing or eliminating the time and effort needed to communicate between a customer and manufacturing engineers or customer engineers.

Figure 2:
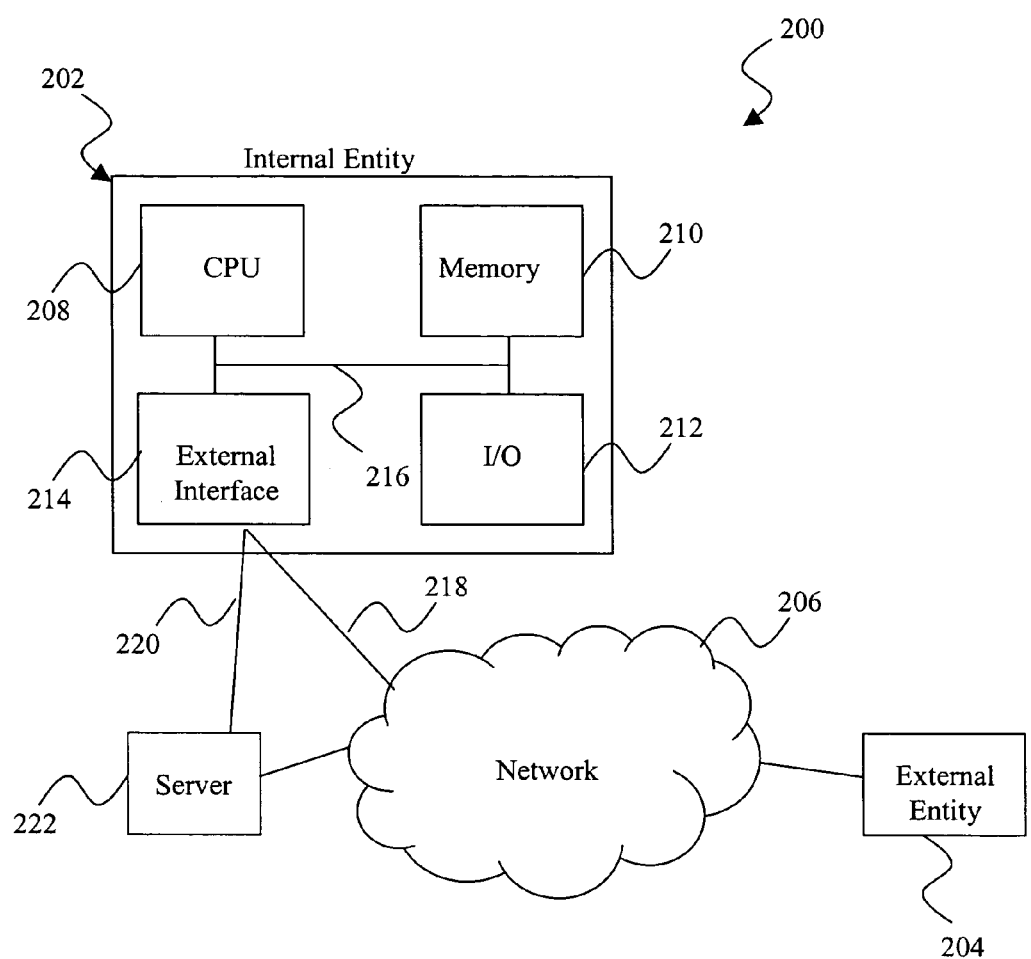
FIG. 2 is a block diagram of one embodiment of a virtual fabrication (fab) system within which the method of FIG. 1 may be executed.

Referring now to FIG. 2, a virtual IC fabrication system (a "virtual fab") 200 provides an exemplary environment within which the method 100 of FIG. 1 may be executed. The virtual fab 200 includes a plurality of entities represented by one or more internal entities 202 and one or more external entities 204 that are connected by a communications network 206. The network 206 may be a single network or may be a variety of different networks, such as an intranet and the Internet, and may include both wireline and wireless communication channels.

Each of the entities 202, 204 may include one or more computing devices such as personal computers, personal digital assistants, pagers, cellular telephones, and the like. For the sake of example, the internal entity 202 is expanded to show a central processing unit (CPU) 208, a memory unit 210, an input/output (I/O) device 212, and an external interface 214. The external interface may be, for example, a modem, a wireless transceiver, and/or one or more network interface cards (NICs). The components 208–214 are interconnected by a bus system 216. It is understood that the internal entity 202 may be differently configured and that each of the listed components may actually represent several different components. For example, the CPU 208 may actually represent a multi-processor or a distributed processing system; the memory unit 224 may include different levels of cache memory, main memory, hard disks, and remote storage locations; and the I/O device 212 may include monitors, keyboards, and the like.

The internal entity 202 may be connected to the communications network 206 through a wireless or wired link 218, and/or through an intermediate network 220, which may be further connected to the communications network. The intermediate network 220 may be, for example, a complete network or a subnet of a local area network, a company wide intranet, and/or the Internet. The internal entity 202 may be identified on one or both of the networks 206, 220 by an address or a combination of addresses, such as a media access control (MAC) address associated with the network interface 214 and an internet protocol (IP) address. Because the internal entity 202 may be connected to the intermediate network 220, certain components may, at times, be shared with other internal entities. Therefore, a wide range of flexibility is anticipated in the configuration of the internal entity 202. Furthermore, it is understood that, in some implementations, a server 222 may be provided to support multiple internal entities 202. In other implementations, a combination of one or more servers and computers may together represent a single entity.

In the present example, the internal entities 202 represents those entities that are directly responsible for producing the end product, such as a wafer or individually tested IC devices. Examples of internal entities 202 include an engineer, customer service personnel, an automated system process, a design or fabrication facility and fab-related facilities such as raw-materials, shipping, assembly or test. Examples of external entities 204 include a customer, a design provider, and other facilities that are not directly associated or under the control of the fab. In addition, additional fabs and/or virtual fabs can be included with the internal or external entities. Each entity may interact with other entities and may provide services to and/or receive services from the other entities.

It is understood that the entities 202, 204 may be concentrated at a single location or may be distributed, and that some entities may be incorporated into other entities. In addition, each entity 202, 204 may be associated with system identification information that allows access to information within the system to be controlled based upon authority levels associated with each entities identification information.

The virtual fab 200 enables interaction among the entities 202, 204 for purposes related to IC manufacturing, as well as the provision of services. In the present example, IC manufacturing can include one or more of the following steps:

receiving or modifying an IC design;
receiving or modifying a customer's IC order of price, delivery, and/or quantity;
receiving or modifying a circuit design;
receiving or modifying a mask change;
receiving or modifying a manufacturing process flow;
receiving or modifying testing parameters;
receiving or modifying assembly parameters; and
receiving or modifying shipping of the ICs.

One or more of the services provided by the virtual fab 200 may enable collaboration and information access in such areas as design, engineering, and logistics. For example, in the design area, the customer 204 may be given access to information and tools related to the design of their product via the fab 202. The tools may enable the customer 204 to perform yield enhancement analyses, view layout information, and obtain similar information. In the engineering area, the engineer 202 may collaborate with other engineers 202 using fabrication information regarding pilot yield runs, risk analysis, quality, and reliability. The logistics area may provide the customer 204 with fabrication status, testing results, order handling, and shipping dates. It is understood that these areas are exemplary, and that more or less information may be made available via the virtual fab 200 as desired.

Another service provided by the virtual fab 200 may integrate systems between facilities, such as between a facility 204 and the fab facility 202. Such integration enables facilities to coordinate their activities. For example, integrating the design facility 204 and the fab facility 202 may enable design information to be incorporated more efficiently into the fabrication process, and may enable data from the fabrication process to be returned to the design facility 204 for evaluation and incorporation into later versions of a chip.

Figure 3:
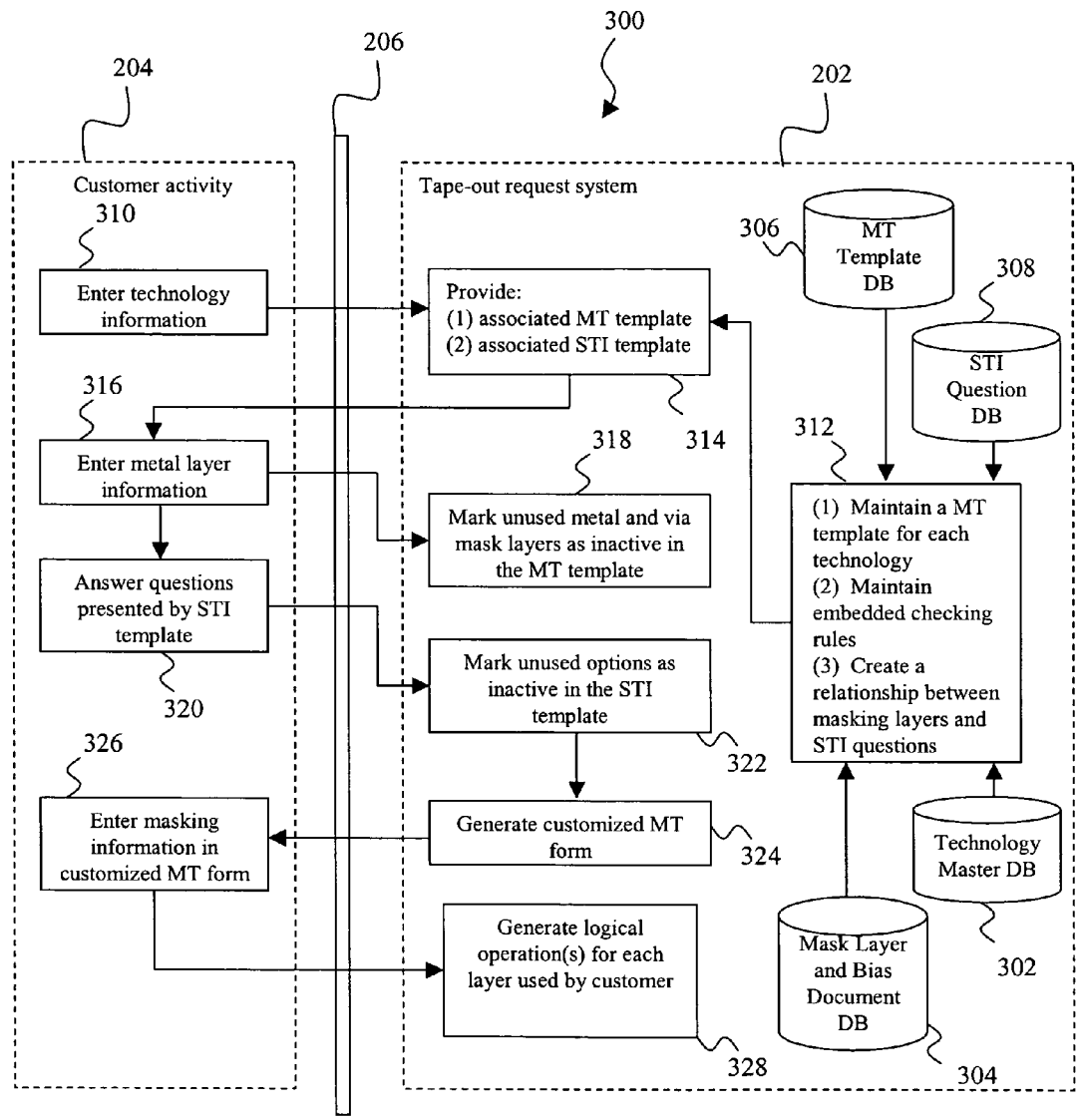
FIG. 3 is a block diagram illustrating an exemplary tape-out request environment within the virtual fab of FIG. 2 and a data flow within that environment.

Referring now to FIG. 3, an exemplary tape-out request environment 300 is illustrated within the virtual fab 200 of FIG. 2. For purposes of example, the environment 300 includes a tape-out request system 202, customer activities 204, and an interface/network 206. It is understood that, although the tape-out request system 202, customer activities 204, and interface/network 206 are shown as separate entities in both FIG. 2 and FIG. 3, in other embodiments, they may be combined and/or further divided. Furthermore, while the tape-out request system 202 is illustrated as being interconnected without the use of the network 206, it is understood that various components of the tape-out request system may communicate via the network 206.

As will be described later in greater detail, the environment 300 may be accessed via the interface/network 206, which may make available to the customer an MT template, an STI template, a customized MT form, and data processing software and hardware. In the present embodiment, the environment includes a technology master database 302, a mask layer and bias document database 304, an MT template database 306, and an STI question database 308. Although illustrated as separate databases, it is understood that each of the databases may be further divided or may be combined into one or more databases. Furthermore, while databases are shown for purposes of example, each database represents any computer accessible memory containing information that may be available to the tape-out request system 202. One or more of the databases 302–308 may further include specification and design rules for both customers and engineers, or such rules may be stored elsewhere. In addition, while not shown, it is understood that the tape-out request system 202 may include one or more processors to provide various functions needed to receive and handle a tape-out request. For example, the tape-out request system 202 may include software instructions and processing means needed to dynamically generate documents based on various standards such as eXtensible Markup Language (XML), hypertext markup language (HTML), and others.

An exemplary data flow may be described between the tape-out request system 202 and customer 204 as follows. In step 310, the customer enters technology information. This information may include business information (e.g., company information, contact person, and order number), as well as technical information (e.g., product, technology, and other general information).

The tape-out request system 202 has access to information from the databases 302–308 using a combination of software instructions and/or engineer input. For example, step 312 illustrates the tape-out request system as performing a variety of functions, including maintaining an MT form template for each technology (e.g., 0.13 $\mu$m or 0.18 $\mu$m), maintaining embedded checking rules that may be applied to verify information and/or identify inconsistencies and incompatibilities, and creating a relationship between masking layers and STI questions. These functions may be modified each time a relevant database is updated, may be manually configured or updated by users, or may be updated dynamically each time a tape-out request is received. Furthermore, the tape-out request system 202 may receive and incorporate information entered by engineers and/or customers.

In step 314, the tape-out request system 202 may load an MT template and an STI template based on the technology information entered by the customer in step 310. For example, the tape-out request system 202 may select and/or generate the MT template and STI template using the functions described with respect to step 312. In some embodiments, the MT template may be a superset of data, with the customer selecting options from or entering data into relevant portions of the template. In other embodiments, the masking information maintained in the MT template may be tailored to serve the particular customer's requirements or particular technology requirements. Accordingly, some items in an MT template may have default values or multiple options for a particular technology. The customer may then enter information for each item not having default information or for which the default information does not match the customer's needs for a particular application. Similarly, questions in the STI template may be generated or loaded based on the initial information entered by the customer. As with the MT template, the STI template may be a superset of questions, with the customer answering only the relevant questions, or the STI template questions may be tailored to serve the particular customer's requirements or particular technology requirements.

The MT template may include built-in technology-specific checking rules based on information retrieved from one or more of the databases 302–308 or from another source (not shown). The MT template provides an interface by which the customer may enter masking related information such as a layer code, a mask layer name description, and bias logical operations. In addition, the masking information generated with the MT template may be a set of information that satisfies various customer requirements. For example, the MT template may provide default values, multiple choice lists of predefined options (e.g., check boxes, radio buttons, pull down lists, etc.), and checking rules that may be used to determine if there are conflicts (e.g., between an entered value and a specific technology) and also to determine the compatibility of manually entered information (e.g., information for which there is no default value) with system requirements, as well as information entered when supplied default information does not match the customer's needs.

The STI template may include questions that are pre-designed based on manufacturing information. Each question may be associated with one or more mask layers by the technology master database 302 and/or the mask layer and bias document database 304. Exemplary STI questions may include whether a metal-insulator-metal (MIM) capacitor is needed; whether ESD implantation is needed; or whether a pure 1.8 V device is satisfactory.

In step 316, the customer may enter metal layer information into the MT template. This information may identify, for example, how many metal layers the customer needs and which layers the customer does not need.

In step 318, based on the metal layer information provided by the customer in step 316, the tape-out request system 202 may mark unused metal layers as inactive in the MT template. This prevents the customer from entering information related to unnecessary masks. Inactive layers may be removed from the template or may be indicated as inactive by, for example, graying out each inactive layer and preventing the customer from editing such layers. The tape-out request system 202 may apply the checking rules to ensure that information regarding required layers has been received and that no incompatibilities or inconsistencies exist. Furthermore, the checking rules may be applied to automatically select certain layers (based on customer selections) or prohibit certain layers from being selected. It is understood that this checking may occur as the customer enters information, after each step, or at the end of the tape-out request process. The checking rules may be embedded in the MT template or may be applied from an outside source to the MT template. In the present example, each time the customer enters information, the MT template is updated to reflect the current state of various layers of the tape-out request.

In step 320, the customer may answer one or more of the STI questions, which aids the tape-out request system 202 in identifying which optional masks are required and which optional masks are not required. Some questions may be mandatory, some may be optional, and some may be mandatory or optional depending on an answer to a previous question. For example, if a question is answered in the affirmative, then the following questions may be mandatory. If the same question is answered in the negative, then the following questions may be marked as inactive or may be optional.

In step 322, based on the answers to the STI questions provided by the customer in step 320, the tape-out request system 202 may mark unused or unneeded options as inactive in the STI template and/or the MT template. This prevents the customer from entering information related to unnecessary masks. Inactive options may be removed from the template or may be indicated as inactive by, for example, graying out each inactive option and preventing the customer from editing or selecting such options. The tape-out request system 202 may apply the checking rules to ensure that information regarding required options has been received and that no incompatibilities or inconsistencies exist. Furthermore, the checking rules may be applied to automatically select certain options (based on customer selections) or prohibit certain options from being selected. The checking rules may be embedded in the STI template or may be applied from an outside source to the STI template. It is understood that this checking may occur as the customer enters information, after each step, or at the end of the tape-out request process. In the present example, each time the customer enters information, the STI template is updated to reflect the current state of various options.

In step 324, a customized MT form may be generated based on the metal layer information and the answers to the STI questions. The customized MT form may illustrate only the mask layers needed or selected by the customer, as well as any optional information. For each of the mask layers, the customized MT form may include the applicable layer ID and name information.

In step 326, the customer may enter needed information for each mask layer, such as a circuit pattern layer number, a process key layer number, and a mask tone (e.g., 'C' for clear or 'D' for dark). The customer may also enter logical operation information.

In step 328, if the customer chooses vendor standard or other predefined or dynamically generated logical operation settings, the tape-out request system 202 may automatically generate logical operation information for each mask layer. In some embodiments, the customer may be able to modify the generated logical operation information.

Bias and logical operation information that is entered or modified by the customer may be checked using the checking rules. The checking rules may be embedded in the customized MT form or may be applied from an outside source to the customized MT form. It is understood that this checking may occur as the customer enters information, after each step, or at the end of the tape-out request process.

After the needed information has been entered, the tape-out request system 202 may use information from the MT form to automatically translate the logical operation information for each mask layer into final logical operations for use in mask manufacturing. During the translation process, the tape-out request system 202 may automatically replace each process layer ID in logical operations with an appropriate circuit pattern layer number. The completed MT form may then be sent to a customer engineer.

It is understood that the templates and forms described in the present disclosure are for purposes of example only, and that the information may be presented to the customer in many different ways. Furthermore, the customer is not limited to entering information into the described forms, but may also submit predefined or precompiled information, which the tape-out request system 202 may process and use to create logical operation information.

Figure 4:
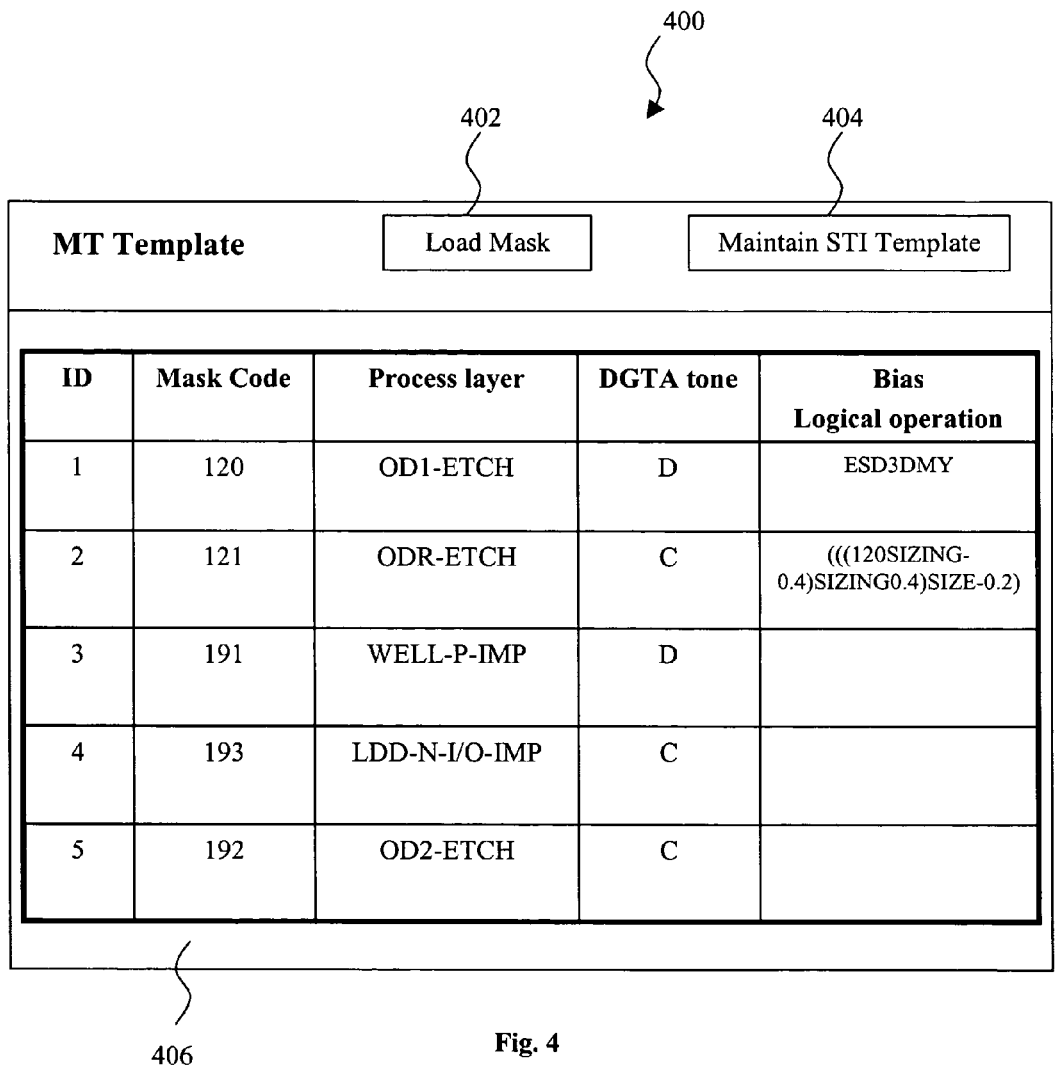
FIG. 4 illustrates an exemplary interface for a mask tooling template that may be used within the environment of FIG. 3.

Referring now to FIG. 4, in yet another embodiment, an interface 400 illustrates an exemplary MT template by which a customer may interact with a tape-out request system (e.g., the tape-out request system 202 of FIG. 3). It is understood that a variety of interfaces may be presented to the customer, including a login interface for authorization validation and a help interface that provides the customer with instructions on how to accomplish various tasks. After the customer logs in to the tape-out request system 202, the interface 400 presents the customer with several options. In the present embodiment, the interface 400 includes a Load Mask button 402, and a Maintain STI Template button 404. The interface 400 also includes a template 406 that provides the customer with a table for all mask related information while the customer issues the tape-out request. The template 406 may include one or more of: a mask ID, a mask code, a process layer, a DGTA tone (e.g., "C" for clear or "D" for dark), and/or a logical operation. As described previously, checking rules from a database may be applied to the template 406 to ensure that no incompatibilities or inconsistencies exist. It is understood that the interface 400 may be altered as desired to extend its functionality and to maximize customer support during tape-out request processing.

Figure 5:
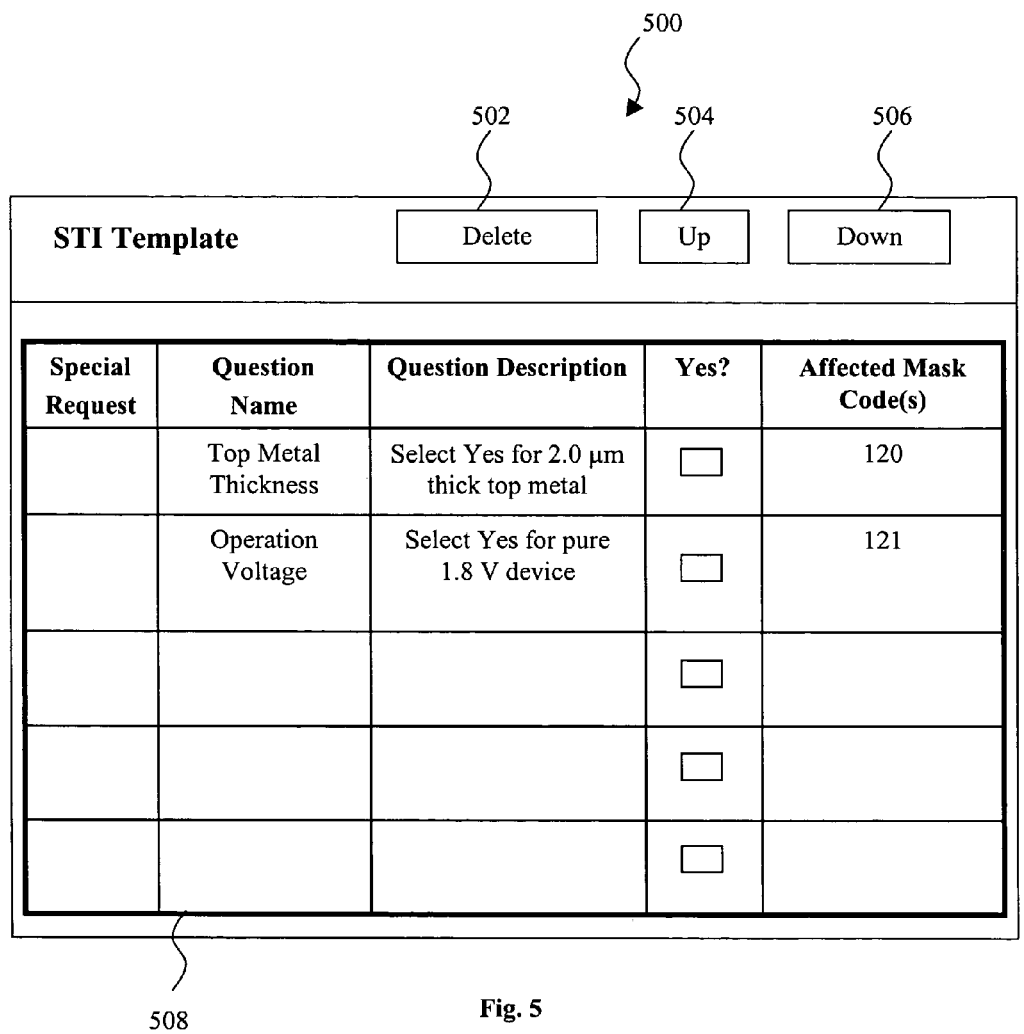
FIG. 5 illustrates an exemplary interface for a special technology information (STI) template that may be used within the environment of FIG. 3.

Referring now to FIG. 5, in another embodiment, an interface 500 illustrates an exemplary STI template by which a customer may interact with a tape-out request system (e.g., the tape-out request system 202 of FIG. 3). It is understood that a variety of interfaces may be presented to the customer, including a login interface for authorization validation and a help interface that provides the customer with instructions on how to accomplish various tasks. The interface 500 presents the customer with several options. In the present embodiment, the interface 500 includes a Delete button 502, an Up button 504, and a Down button 506. The interface 500 also includes a template 508 that provides the customer with a table for some or all STI questions, which may include items such as: Special Request, Question Name, Question Description, check boxes to indicate Yes, and affected mask codes. As described previously, checking rules from a database may be applied to the template 508 to ensure that no incompatibilities or inconsistencies exist. It is understood that the interface 500 may be altered as desired to extend its functionality and to maximize customer support during tape-out processing.

Referring now to FIG. 6, in still another embodiment, an interface 600 illustrates an exemplary customized MT form by which a customer may interact with a tape-out request system (e.g., the tape-out request system 202 of FIG. 3). The interface 600 presents the customer with several options. In the present embodiment, the interface 600 includes a Company field 602, a Product field 604, a Contact Person field 606, a Telephone field 608, an Email field 610, a Save As Draft button 612, a Check button 614, a Save button 616, and a Back button 618. The interface 600 also includes a template 620 that provides the customer with a table for customized mask tooling information, which may include one or more of the following items: a Mask ID, a Process Layer, a CAD Layer Number, a Process Key CAD Layer Number, a DGTA Tone, a Logical Operation, and/or a Logical Operation Translation. As described previously, checking rules from a database may be applied to the template 620 to ensure that no incompatibilities or inconsistencies exist. It is understood that the interface 600 may be altered as desired to extend its functionality and to maximize customer support during tape-out processing.

Figure 7:
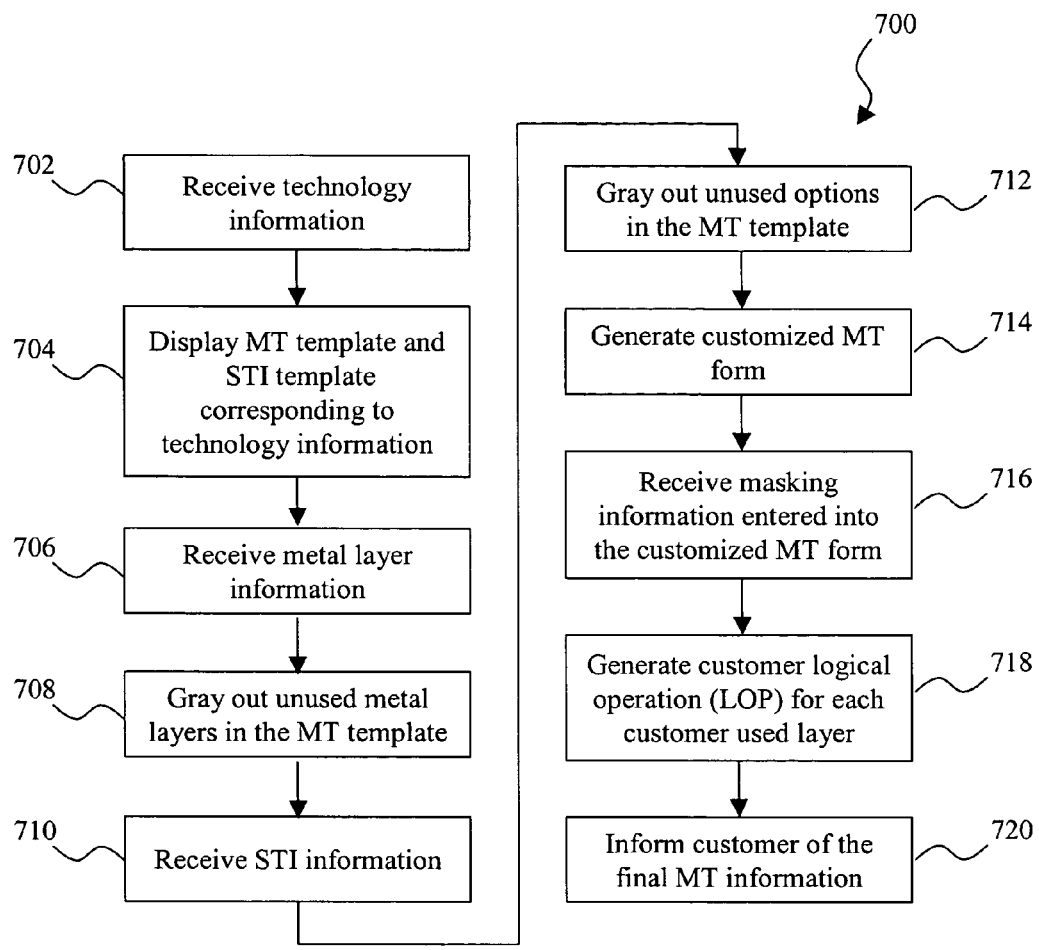
FIG. 7 illustrates another embodiment of a method for handling a tape-out request.

Referring now to FIG. 7, in yet another embodiment, a method 700 may aid in the creation of a tape-out request for an IC mask design. For sake of example, the method 700 may be used within the tape-out request system 202 of FIG. 3 to respond to tape-out request by a customer while minimizing or eliminating the need for engineer interaction.

In step 702, technology information is received from a customer. The information may include business information (e.g., company information, contact person and order number), as well as technical information (e.g., product, technology, and other general information). For example, such information may identify a technology or technological details that may aid in identifying an MT template.

In step 704, the tape-out request system 202 may, based on the customer entered information, display an MT template and an STI template. As previously described, the MT template may provide default values, multiple choice lists of predefined options (e.g., radio buttons, pull down lists, etc.), and checking rules. The checking rules may be used to determine if there are conflicts (e.g., between an entered value and a specific technology) and also to determine the compatibility of manually entered information (e.g., information for which there is no default value) with system requirements, as well as information entered when supplied default information does not match the customer's needs.

In step 706, metal layer information specified by the customer in the MT template may be received. Information provided or selected by the customer may include, for example, metal types and thicknesses.

In step 708, the metal layer information may be used to customize MT information in the MT template. For example, any non-required interlayer metal masks may be removed from the MT template or marked as non-selectable (e.g., assigned a gray background and made non-editable by the customer) to eliminate unnecessary mask layers. More specifically, if the current masking type allows a maximum of eight metal layers and the customer selects six metal layers, then two metals and two corresponding vias in the MT template may be "grayed out" so the customer will not enter information for these two unneeded metal layers.

In step 710, STI information may be received. The STI information may include the customer's answers to one or more STI questions provided by the STI template. Each question may be associated with one or more mask layers and may enable the tape-out request system 202 to more specifically identify the customer's technology needs.

In step 712, the answers to the STI questions may be incorporated into the MT template to gray out unused mask layers. As described previously with the metal layers, unused mask layers may be deactivated in the MT template to prevent the customer from entering information related to unnecessary masks. It is understood that the customer may input the metal layer information and STI information at the same time and the non-required inter metal layers and unused option layers may be deactivated or "grayed out" in the customized MT form.

In step 714, the tape-out request system 202 may generate a customized MT form that incorporates the customer entered information regarding metal layers and STI answers.

For each of the mask layers, the customized MT form may include layer ID and name information.

In step 716, masking information may be received from the customer via the customized MT form. For example, the customer may enter relevant information for each process layer, such as a circuit pattern layer number, a process key layer number, and a mask tone (e.g., 'C' for clear or 'D' for dark).

In step 718, if the customer chooses vendor standard logical operation settings, the tape-out request system 202 may automatically generate logical operation information for each mask layer using the information received via the customized MT form. The generated logical operation information may be modifiable by the customer. After any checking is completed, the MT template may automatically translate the logical operation information for each mask layer into final logical operation information for use in mask manufacturing. During the translation process, the MT template may automatically replace each mask layer ID in logical operations with an appropriate circuit pattern layer number.

In step 720, the completed MT form may be sent to a customer for user confirmation.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the disclosure will be employed without a corresponding use of other features. For example, although logical operations are used for purposes of illustration, it is understood that the present disclosure may be applied to bias and/or other operations. Accordingly, it is appropriate that the appended claims be construed broadly and in a manner consistent with the scope of the disclosure.

What is claimed is:

1. A computer-executable method for receiving a tape-out request for an integrated circuit design and generating tape-out information based on the request, the method comprising:
   receiving technology information identifying a technology for the tape-out request;
   loading a mask tooling (MT) template for the technology and loading a special technology information (STI) template containing questions based on the received information;
   receiving metal layer information defining at least one metal layer for the design and receiving answers to the questions;
   generating a customized MT form based on the received metal layer information and answers;
   receiving masking information via the customized MT form; and
   generating one or more logical operations based on the received masking information.

2. The computer-executable method of claim 1 further comprising marking at least a portion of the MT template as inactive based on the received metal layer information and answers.

3. The computer-executable method of claim 2 wherein marking the portion of the MT template as inactive includes graying out the inactive portion, wherein a user cannot alter the inactive portion.

4. The computer-executable method of claim 2 wherein unused metal layers displayed in the MT template are marked as inactive in response to the received metal layer information and wherein unused option layers displayed in the STI template are marked as inactive in response to the answers.

5. The computer-executable method of claim 2 further comprising manually activating unused option layers in the customized MT form by a customer via a special request.

6. The computer-executable method of claim 2 further comprising manually deactivating active layers in the customized MT form by a customer via a special request.

7. The computer-executable method of claim 1 further comprising selecting the MT template from a plurality of MT templates, wherein the MT templates are differentiated by technology.

8. The computer-executable method of claim 1 further comprising generating the MT template based on the technology prior to loading the MT template.

9. The computer-executable method of claim 1 further comprising selecting the STI template based on the received information.

10. The computer-executable method of claim 1 further comprising generating the STI template based on the received information, wherein the generating incorporates questions into the STI template that are specific to the technology.

11. The computer-executable method of claim 1 further comprising checking at least a portion of the received technology information, received metal layer information, received answers, and received masking information using a set of predefined rules to determine whether inconsistencies exist.

12. The computer-executable method of claim 1 further comprising creating a relationship between a plurality of masking layers and the questions contained in the STI template.

13. The computer-executable method of claim 1 further comprising sending the generated logical operation to a manufacturing facility.

14. A system for receiving a tape-out request for an integrated circuit design and generating tape-out information based on the request, the system comprising:
   a tape-out request system having at least one processor accessible to at least one memory containing a plurality of mask tooling templates, mask layer information, logical operation information, and technology questions;
   a network accessible to the tape-out request system;
   a customer interface accessible to the tape-out request system via the network and configured to receive customer entered information; and
   a plurality of instructions for execution by the processor, the instructions including:
      instructions for receiving information identifying a technology for the tape-out request;
      instructions for loading a mask tooling (MT) template based on the received information;
      instructions for receiving metal layer information defining at least one metal layer for the design;
      instructions for generating a customized MT form based at least partially on the received metal layer information;
      instructions for receiving masking information via the customized MT form; and
      instructions for generating one or more logical operations based on the received masking information.

15. The system of claim 14 further comprising:

instructions for loading a special technology information (STI) template containing a plurality of questions based on the received information;

instructions for receiving answers to the questions; and instructions for generating the customized MT form based at least partially on the answers.

16. The system of claim 15 further comprising instructions for marking at least a portion of the MT template as inactive based on the received metal layer information and answers.

17. The system of claim 15 further comprising instructions for associating each of the plurality of questions with one of a plurality of mask layers contained within the MT template.

18. The system of claim 14 wherein the least one memory comprises four databases, including a first database configured to store the plurality of mask tooling templates, a second database configured to store the mask layer information, a third database configured to store the logical operation information, and a fourth database configured to store the technology questions.

19. The system of claim 14 further including instructions for checking at least a portion of the received information, received metal layer information, and received masking information using a set of predefined rules to determine whether inconsistencies exist.

20. The system of claim 14 further comprising instructions for sending the generated logical operations to a manufacturing facility.

21. The system of claim 14 further comprising instructions for enabling a user to modify the generated logical operations.

22. The system of claim 14 further comprising instructions for enabling a user to enter a logical operation.

23. The computer-executable method of claim 14 further comprising instructions for manually activating unused option layers in the customized MT form by a user.

24. The computer-executable method of claim 14 further comprising instructions for manually deactivating active layers in the customized MT form by a user.

25. The system of claim 14 wherein the MT template contains a superset of MT information.

26. The system of claim 14 further comprising instructions for maintaining a plurality of MT templates, wherein the MT templates are each for a different technology.

27. A computer-executable method for generating tape-out information for a tape-out request, the method comprising:

receiving initial information from a customer;

loading a mask tooling template based on the initial information;

customizing a mask tooling form based on metal layer information provided by the customer and answers to questions provided to the customer; and generating logical operations based on information received from the customer via the mask tooling form.

28. The computer-executable method of claim 27 further comprising loading a plurality of technology questions, wherein each technology question is associated with at least one of a plurality of mask layers in the mask tooling form, and wherein each technology question is designed to identify specific information about the corresponding mask layer.

29. The computer-executable method of claim 27 further comprising marking portions of the mask tooling template as inactive based at least partially on the metal layer information provided by the customer.

30. The computer-executable method of claim 27 further comprising marking portions of the mask tooling form as inactive based at least partially on the answers to special technology information questions provided by the customer.

* * * * *